United States Patent
Hong et al.

(10) Patent No.: US 9,496,320 B2
(45) Date of Patent: Nov. 15, 2016

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Sangmin Hong, Yongin (KR); Jungi Youn, Yongin (KR); Goeun Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/682,540

(22) Filed: Apr. 9, 2015

(65) Prior Publication Data

US 2016/0111478 A1    Apr. 21, 2016

(30) Foreign Application Priority Data

Oct. 17, 2014  (KR) .................. 10-2014-0141194

(51) Int. Cl.
*H01L 27/32*  (2006.01)
*H01L 51/52*  (2006.01)

(52) U.S. Cl.
CPC ....... *H01L 27/3225* (2013.01); *H01L 27/3276* (2013.01); *H01L 51/5246* (2013.01)

(58) Field of Classification Search
CPC .................. H01L 27/3276; H01L 27/3225
See application file for complete search history.

(56) References Cited

U.S. PATENT DOCUMENTS

| 6,833,560 B2* | 12/2004 | Konuma ................. H01L 27/12 257/66 |
| 7,474,375 B2* | 1/2009 | Kwak .................. H01L 51/5237 349/149 |
| 2008/0238302 A1* | 10/2008 | Sung .................... H01L 51/5237 313/504 |
| 2014/0132149 A1 | 5/2014 | Song et al. |
| 2015/0236297 A1 | 8/2015 | Hong et al. |

FOREIGN PATENT DOCUMENTS

| KR | 10-2005-0113491 A | 12/2005 |
| KR | 10-2005-0114141 A | 12/2005 |
| KR | 10-2006-0040431 A | 5/2006 |
| KR | 10-2006-0113005 A | 11/2006 |
| KR | 10-2008-0055138 A | 6/2008 |
| KR | 10-2014-0061095 | 5/2014 |
| KR | 10-2015-0098284 | 8/2015 |

\* cited by examiner

*Primary Examiner* — Yu-Hsi D Sun
(74) *Attorney, Agent, or Firm* — Lee & Morse, P.C.

(57) ABSTRACT

An organic light-emitting display apparatus includes a first substrate, a display unit that defines an active area on the first substrate, a second substrate on the display unit, a circuit pattern on outer sides of the active area on the first substrate, a sealant between the first substrate and the second substrate, the sealant adhering the first substrate to the second substrate and overlapping at least a part of the circuit pattern, and a detecting unit that overlaps the at least a part of the circuit pattern and detects whether the circuit pattern is damaged.

9 Claims, 6 Drawing Sheets

ORGANIC LIGHT-EMITTING DISPLAY APPARATUS

CROSS-REFERENCE TO RELATED APPLICATION

Korean Patent Application No. 10-2014-0141194, filed on Oct. 17, 2014, in the Korean Intellectual Property Office, and entitled: "Organic Light-Emitting Display Apparatus," is incorporated by reference herein in its entirety.

BACKGROUND

1. Field

Embodiments relate to an organic light-emitting display apparatus.

2. Description of the Related Art

In general, display devices such as an organic light-emitting display apparatus including a thin film transistor (TFT) may be used in mobile devices such as smartphones, tablet personal computers, ultra-slim laptops, digital cameras, video cameras, or portable information terminals and electronic/electric products such as ultra-thin televisions.

In an organic light-emitting display apparatus, sealing between an upper substrate and a lower substrate is needed to protect an organic light-emitting device from external factors. In this regard, a sealing member is applied between the upper and lower substrates, and the sealing member is hardened to adhere the upper and lower substrates to each other. Accordingly, the lifespan and reliability of a display device including the organic light-emitting display apparatus are dependent upon the adhesion degree between the upper and lower substrates.

SUMMARY

Embodiments are directed to an organic light-emitting display apparatus including a first substrate, a display unit that defines an active area on the first substrate, a second substrate on the display unit, a circuit pattern on outer sides of the active area on the first substrate, a sealant between the first substrate and the second substrate, the sealant adhering the first substrate to the second substrate and overlapping at least a part of the circuit pattern, and a detecting unit that overlaps the at least a part of the circuit pattern and detects whether the circuit pattern is damaged.

The circuit pattern may include a signal line and a connection line that electrically connects the signal line and the display unit.

The display unit may include a first electrode, a second electrode, and an intermediate layer between the first electrode and the second electrode. The signal line may be electrically connected to the second electrode via the connection line.

The sealant may overlap a part of the connection line.

At least a part of the detecting unit may be under an area where the connection line overlaps the sealant. The detecting unit may be electrically connected to the connection line. The detecting unit may detect whether the connection line is damaged.

The detecting unit may include a plurality of thin film transistors that are respectively electrically connected to a plurality of points of the connection line.

The detecting unit may include a plurality of lines that respectively contact a plurality of points on the connection line.

The connection line and the signal line may be positioned on different layers from each other. At least a part of the connection line may overlap the signal line.

The organic light-emitting display apparatus may further include an insulating layer between the sealant and the signal line.

A thickness of the connection line may be in a range of about 10% to about 30% of a thickness of the signal line.

The connection line may be formed of a same material as the first electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
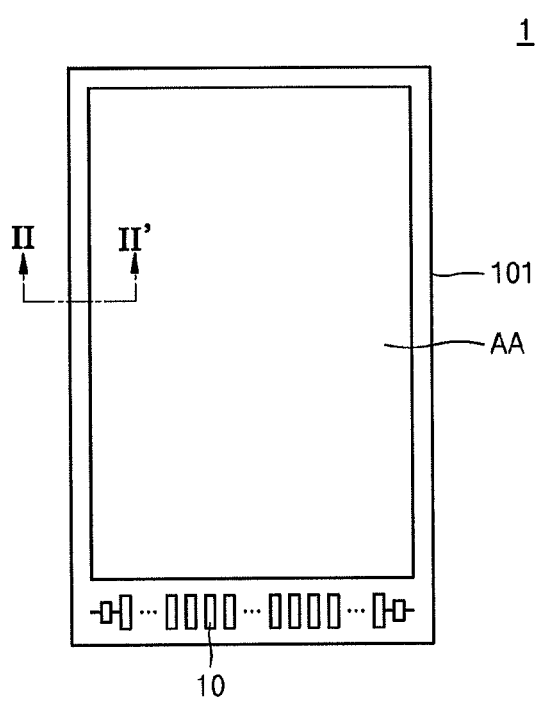
FIG. 1 illustrates a schematic plan view depicting an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list. It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

Figure 2:
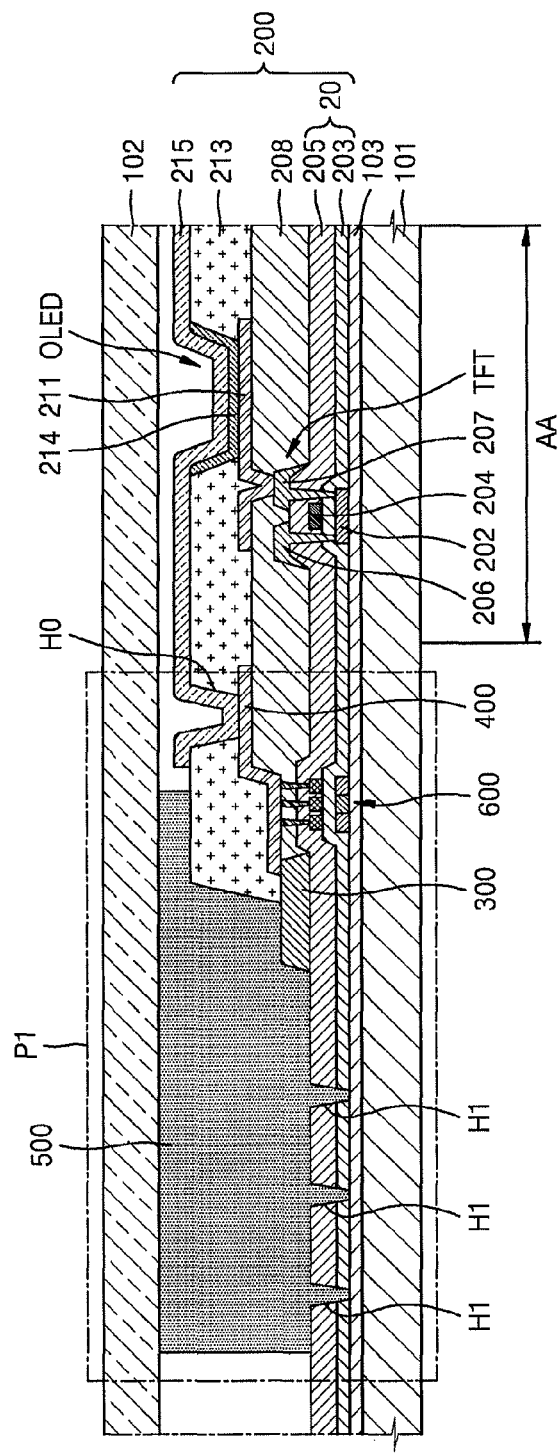
FIG. 2 illustrates a cross-sectional view of the organic light-emitting display apparatus taken along the line II-II' in FIG. 1.
Figure 3:
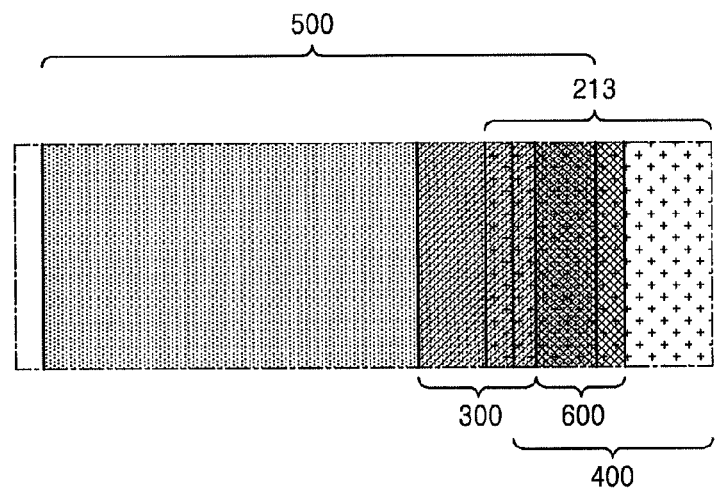
FIG. 3 illustrates a plan view of the part P1 in FIG. 2.

FIG. 1 illustrates a schematic plan view of an organic light-emitting display apparatus 1 according to an embodiment. FIG. 2 illustrates a cross-sectional view of the organic light-emitting display apparatus 1 taken along the line II-II' in FIG. 1; and FIG. 3 is a plan view of the part P1 in FIG. 2.

Referring to FIGS. 1 and 2, the organic light-emitting display apparatus 1 according to an embodiment includes a first substrate 101, a display unit 200 that defines a active area AA on the first substrate 101, a signal line 300 and a connection line 400 (collectively referred to as "circuit pattern 300 and 400") formed on outer sides of the active area AA, a second substrate 102 disposed on the display unit 200, a sealant 500 adhering the first substrate 101 and the second substrate 102, and a detector 600 that detects damage to the circuit pattern 300 and 400.

The first substrate 101 may be a glass substrate having rigidity, a polymer substrate, a film having flexibility, a metal substrate, or a composite substrate thereof. In some embodiments, the first substrate 101 may be a bendable substrate and may be formed of plastic with excellent heat-resistance and durability.

The display unit 200 defines the active area AA on the first substrate 101. The display unit 200 includes a thin film transistor TFT and an organic light-emitting device OLED that are electrically connected to each other. Pad units 10 are disposed on outer sides of the active area AA. The pad units 10 may transmit an electrical signal received from a power supply device (not shown) or a signal generating device (not shown) to the active area AA.

Hereinafter, the display unit 200 is described in detail by referring to FIG. 2.

A buffer layer 103 may be disposed on the first substrate 101. The buffer layer 103 may be disposed on the whole surface of the first substrate 101, for example, on both the active area AA and the outer sides of the active area AA. The buffer layer 103 may prevent penetration of impurity elements through the first substrate 101 and may provide a flat surface on the first substrate 101. A suitable material for preventing or hindering such penetration of impurity elements may be used to form the buffer layer 103.

An insulating layer 20 may be disposed on the first substrate 101. The insulating layer 20 may include a gate insulating layer 203 and an interlayer insulating layer 205.

The thin film transistor TFT may be disposed on the buffer layer 103. The thin film transistor TFT may include an active layer 202, a gate electrode 204, a source electrode 206, and a drain electrode 207.

The active layer 202 may be formed of an inorganic semiconductor such as amorphous silicon or polysilicon, an organic semiconductor, or an oxide semiconductor, and includes a source area, a drain area, and a channel area.

The gate insulating layer 203 may be disposed on the active layer 202. The gate insulating layer 203 may be disposed to correspond to the whole area of the first substrate 101. For example, the gate insulating layer 203 may be disposed to correspond to both the active area AA and the outer sides of the active area AA on the first substrate 101. The gate insulating layer 203 may be disposed on the first substrate 101 to insulate the active layer 202 from the gate electrode 204. The gate insulating layer 203 may be formed of an organic material or an inorganic material such as $SiN_x$ or $SiO_2$.

The gate electrode 204 may be disposed on the gate insulating layer 203. The gate electrode 204 may be formed of a suitable material in consideration of its design conditions. For example, the gate electrode 204 may contain Au, Ag, Cu, Ni, Pt, Pd, Al, Mo, or an alloy such as an Al—Nd alloy or a Mo—W alloy, The interlayer insulating layer 205 may be disposed on the gate electrode 204. The interlayer insulating layer 205 may be disposed to correspond to the whole area of the first substrate 101. For example, the interlayer insulating layer 205 may be disposed to correspond to both the active area AA and the outer sides of the active area AA on the first substrate 101.

The interlayer insulating layer 205 may be disposed between the gate electrode 204 and the source electrode 206 and between the gate electrode 204 and the drain electrode 207 for insulation therebetween. The interlayer insulating layer 205 may be formed of an inorganic material such as $SiN_x$ or $SiO_2$.

The circuit pattern 300 and 400 may be disposed on the outer sides of the active area AA and include a signal line 300 and a connection line 400, which electrically connects the signal line 300 to the display unit 200. A thickness of the connection line 400 may be about 10% to about 30% of a thickness of the signal line 300.

The signal line 300 may be disposed on the interlayer insulating layer 205. The signal line 300 may be disposed on the outer sides of the active area AA. The signal line 300 may be electrically connected to a second electrode 215 via the connection line 400 and thus may transmit a signal to the second electrode 215.

The signal line 300 may be a cathode power line (ELVSS). When the signal line 300 is a cathode power line (ELVSS), the cathode power line (ELVSS) may be connected to a cathode power source having a voltage that is lower than a common power voltage, for example, a ground voltage or a negative (−) voltage. The signal line 300 may be formed in the same manner and with the same material as is used in formation of the source electrode 206 or the drain electrode 207. For example, the signal line 300 may have a structure in which a Ti layer, an Al layer, and a Ti layer are stacked.

A first hole H1 may be formed in the insulating layer 20. The first hole H1 may be formed in the outer sides of the active area AA. A plurality of the first holes H1 may be formed in the insulating layer 20. The first holes H1 may be formed in the insulating layer 20 and a sealant 500 may be formed on the insulating layer 20 by filling the first holes H1. Accordingly, a contact area of the sealant 500 and the insulating layer 20 may be increased, and an adhesive strength between the first substrate 101 and the second substrate 102 may be increased.

The source electrode 206 and the drain electrode 207 may be disposed on the interlayer insulating layer 205. The interlayer insulating layer 205 and the gate insulating layer 203 may be formed as to expose the source area and the drain area of the active layer 202. The source electrode 206 and the drain electrode 207 may be formed as to contact the exposed source and drain areas of the active layer 202.

FIG. 2 illustrates the thin film transistor TFT as being a top gate type that includes the active layer 202, the gate electrode 204, and the source and drain electrodes 206 and 207 that are sequentially staked in the stated order. In other implementations, the gate electrode 204 may be disposed under the active layer 202.

The thin film transistor TFT may be electrically connected to the organic light-emitting device OLED to operate the organic light-emitting device OLED. The TFT may be covered by a passivation layer 208 to be protected from the external environment.

The passivation layer 208 may be an inorganic insulating layer and/or an organic insulating layer.

The connection line 400 may be disposed on the passivation layer 208. The connection line 400 may contact the signal line 300 such that the second electrode 215 and the signal line 300 are electrically connected. The connection line 400 may be formed in the same manner and with the same material as is used in formation of the first electrode 211. For example, the connection line 400 may have a stack structure of ITO layer/Ag layer/ITO layer.

The organic light-emitting device OLED may be disposed on the passivation layer 208. The organic light-emitting device OLED may include a first electrode 211, an intermediate layer 214, and the second electrode 215.

The first electrode 211 may be disposed on the passivation layer 208. For example, the passivation layer 208 may be formed to expose a predetermined area of the drain electrode 207 and not to cover the whole surface of the drain electrode 207, an the first electrode 211 may be formed to contact the exposed area of the drain electrode 207.

The first electrode 211 may be a reflective electrode. For example, the first electrode 211 may have a stack structure of ITO layer/Ag layer/ITO layer.

The second electrode 215 disposed opposite to the first electrode 211 may be a transparent electrode or a semitransparent electrode.

The second electrode 215 may transmit light emitted from an organic light-emitting layer included in the intermediate layer 214. For example, the organic light-emitting display apparatus 1 may be a top-emitting type in which light emitted from the organic light-emitting layer is directly reflected or reflected by the first electrode 211 formed of a reflective electrode and is emitted in a direction toward the second electrode 215.

In other implementations, the organic light-emitting display apparatus 1 may be a bottom-emission type, in which light emitted from the organic light-emitting layer is emitted in a direction toward the first substrate 101. In this case, the first electrode 211 may be a transparent electrode or a semitransparent electrode, and the second electrode 215 may be a reflective electrode. Also, the organic light-emitting display apparatus 1 may be a both sides emission type, in which light is emitted in both directions toward the top and bottom of the organic light-emitting display apparatus 1.

A pixel defining layer 213 is disposed on the first electrode 211. The pixel defining layer 213 may be an insulating layer that includes an insulating material.

The pixel defining layer 213 may be disposed on the signal line 300. The pixel defining layer 213 may cover the connection line 400. A contact hole H0 may be formed in the pixel defining layer 213. The second electrode 215 may be disposed on the pixel defining layer 213 and may contact the connection line 400 via the contact hole H0. The second electrode 215 may be electrically connected to the signal line 300 through the connection line 400.

The pixel defining layer 213 may expose a predetermined area of the first electrode 211. The intermediate layer 214 may be disposed on the exposed area of the first electrode 211.

The intermediate layer 214 may include an organic light-emitting layer. In some implementations, the intermediate layer 214 may include an organic light-emitting layer and may further include one or more functional layers in addition to the organic light-emitting layer. For example, the intermediate layer 214 may include an organic light-emitting layer (an emission layer) and may further include at least one of a hole injection layer (HIL), a hole transport layer (HTL), an electron transport layer (ETL), and an electron injection layer (EIL) in addition to the organic light-emitting layer.

The second substrate 102 may be disposed on the second electrode 215. The second substrate 102 may be formed of a suitable material, such as metal or glass. In some implementations, the second substrate 102 may be a flexible or bendable substrate and may be formed of plastic having excellent heat-resistance and durability.

The sealant 500 may be disposed between the first substrate 101 and the second substrate 102. The sealant 500 may adhere to or attach the first substrate 101 and the second substrate 102. The sealant 500 may be formed on the outer sides of the active area AA. The sealant 500 may include a glass frit. The sealant 500 may serve as a main blocking layer that protects an organic material of the display unit 200 from impurities, such as oxygen and moisture from the outside.

The sealant 500 may be disposed on the insulating layer 20. The sealant 500 may be formed while filling the first holes H1 in the insulating layer 20, which may improve the adhesive strength between the first substrate 101 and the second substrate 102.

The sealant 500 may cover at least a part of the circuit pattern 300 and 400. For example, a formation area of the sealant 500 may extend to an area where the circuit pattern 300 and 400 is formed such that adhesive strength between the first substrate 101 and the second substrate 102 may be improved.

Hereinafter, the formation area of the sealant 500 is described in detail by referring to FIG. 3.

Referring to FIGS. 2 and 3, the sealant 500 may overlap the signal line 300 and at least a part of the connection line 400. A part of the signal line 300 may be overlapped by a part of the connection line 400 such that the signal line 300 contacts the connection line 400. The connection line 400 may be covered by the pixel defining layer 213.

The sealant 500 may cover at least a part of the signal line 300 and may be formed to cover a part of the pixel defining layer 213, which covers the connection line 400. The sealant 500 may contact the signal line 300. As described above, when the formation area of the sealant 500 is increased so as to overlap the circuit pattern 300 and 400, adhesive strength between the first substrate 101 and the second substrate 102 may be improved, and thus apparatus reliability may be improved.

However, when the formation area of the sealant is extended to overlap the circuit pattern 300 and 400, there is a possibility that damage could occur to the circuit pattern 300 and 400 due to heat applied to the sealant 500 or by the heated sealant 500 during a process of forming the sealant 500.

In order to adhere the first substrate 101 and the second substrate 102 by using the sealant 500, the sealant 500 may be melted and cured. A laser may be directed to the sealant 500 to melt the sealant 500. When heating of the sealant 500 is performed by using a laser, the sealant 500 may be heated up to a temperature of about 650° C. There is a possibility that the circuit pattern 300 and 400 adjacent to the sealant 500 could be damaged due to the heated sealant 500.

In the current embodiment, the organic light-emitting display apparatus 1 includes a detecting unit 600 that overlaps at least a part of the circuit pattern 300 and 400 and detects damage to the circuit pattern 300 and 400. A range within which the sealant 500 may overlap the circuit pattern 300 and 400 without damaging the circuit pattern 300 and 400 may be calculated using the detecting unit 600.

Figure 4:
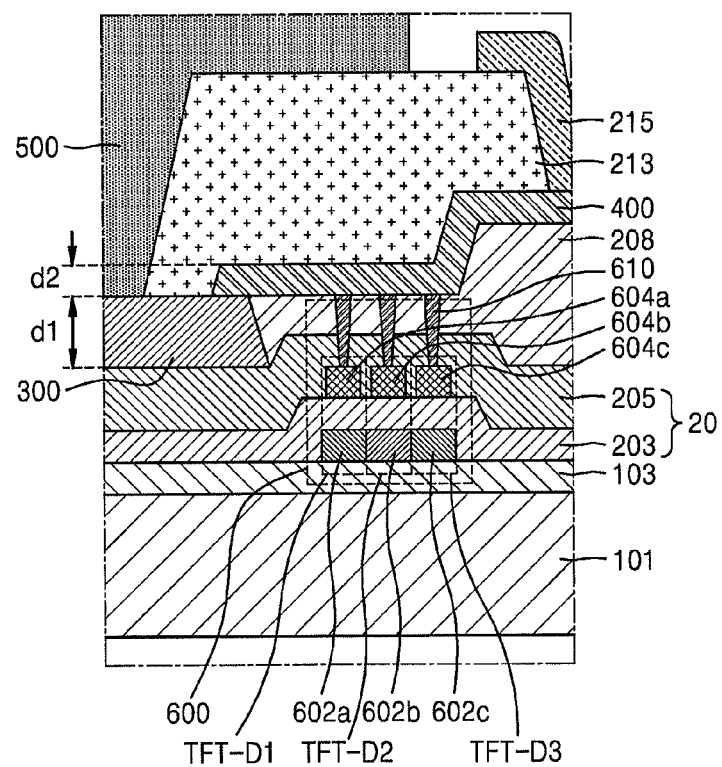
FIG. 4 illustrates a cross-sectional view of an enlarged part of FIG. 2.
Figure 5:
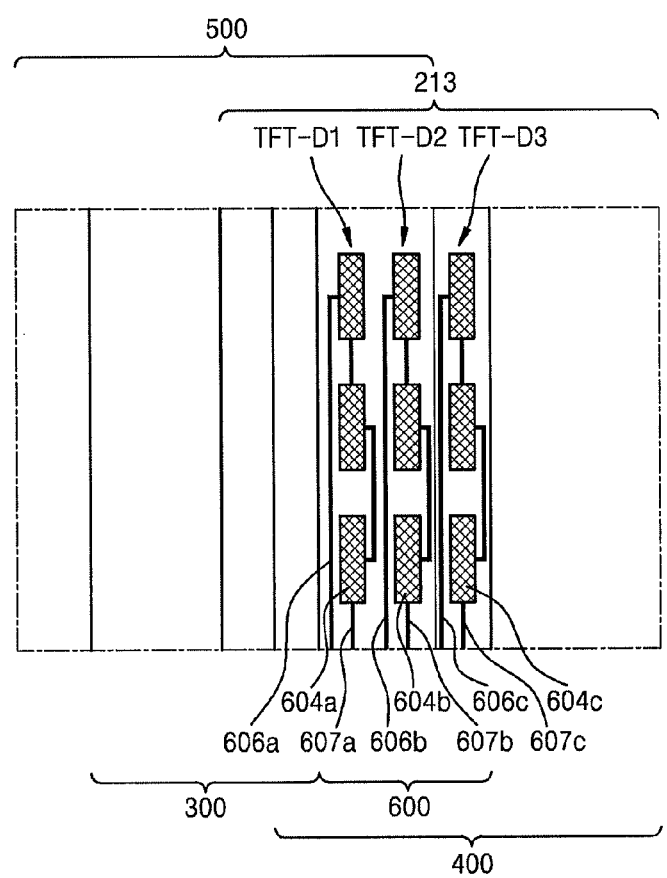
FIG. 5 illustrates a plan view schematically depicting a detecting unit in FIG. 4.

FIG. 4 illustrates a cross-sectional view that is an enlarged view of a portion of FIG. 2. FIG. 5 illustrates a plan view schematically depicting the detecting unit 600 shown in FIG. 4. In FIG. 5, although gate electrodes 604a, 604b, and 604c and source/drain electrodes 606a, 606b, and 606c/607a, 607b, and 607c appear to be connected, this is only because of the plan view perspective. It is to be understood that the gate electrodes 604*a*, 604*b*, and 604*c* and source/drain electrodes 606*a*, 606*b*, and 606*c*/607*a*, 607*b*, and 607*c* are electrically insulated. Referring to FIGS. 4 and 5, an example of the detecting unit 600 according to an embodiment is described in detail.

A thickness of the connection line 400 may be thinner than that of the signal line 300. For example, a thickness of the connection line 400 (d2) may be in a range of about 10% to about 30% of a thickness of the signal line 300 (d1). Compared to the signal line 300, the relatively thin connection line 400 may be easily damaged when the connection line 400 is overlapped by the sealant 500. Even when the pixel defining layer 213, which is an insulating layer, is disposed between the connection line 400 and the sealant 500, the connection line 400 may be easily damaged compared to the signal line 300 due to heat transferred by the pixel defining layer 213.

The sealant 500 may be formed to overlap a part of the connection line 400. At least a part of the detecting unit 600 may be disposed under an area where the connection line 400 overlaps the sealant 500.

The detecting unit 600 may be electrically connected with the connection line 400 and may detect whether the connection line 400 is damaged. The detecting unit 600 may be electrically connected to the connection line 400 via metal rods 610.

When the connection line 400 is damaged, for example, when the connection line 400 is detached from the signal line 300 or when a part of the connection line 400 is disconnected, a voltage applied to the signal line 300 may not be transferred to the connection line 400 in a normal manner. In this regard, the detecting unit 600 electrically connected to the connection line 400 may detect different signals depending on whether the connection line 400 is damaged or is not damaged. The detecting unit 600 may detect whether the connection line 400 is damaged.

For example, the detecting unit 600 may include a plurality of thin film transistors TFT-D1, TFT-D2, and TFT-D3 that electrically contact a plurality of points of the connection line 400, respectively.

The plurality of thin film transistors TFT-D1, TFT-D2, and TFT-D3 may include an active layer 602*a*, 602*b*, and 602*c*, the gate electrodes 604*a*, 604*b*, and 604*c*, the source electrodes 606*a*, 606*b*, and 606*c*, and the drain electrodes 607*a*, 607*b*, and 607*c*

The gate electrodes 604*a*, 604*b*, and 604*c* of the plurality of thin film transistors TFT-D1, TFT-D2, and TFT-D3 may be separated from each other and may be electrically connected to the plurality of points of the connection line 400 via the metal rods 610.

A voltage of each of the drain electrodes 607*a*, 607*b*, and 607*c* of the plurality of thin film transistor TFT-D1, TFT-D2, and TFT-D3 which are electrically in contact with the plurality of points of the connection line 400 may be measured, and thus, whether the connection line 400 electrically connected to the gate electrodes 604*a*, 604*b*, and 604*c* is damaged may be detected. When damage of the connection line 400 is detected, a location of the damage may be detected.

When the connection line 400 is damaged by heating of the sealant 500, the damage may occur at various locations. For example, a part of the connection line 400 in contact with the signal line 300 may be damaged, and thus the connection line 400 and the signal line 300 may be detached. As another example, the connection line 400 may be disconnected due to damage to the connection line 400 at a location other than the part in contact with the signal line 300.

When the connection line 400 and the signal line 300 are detached, a voltage applied from the signal line 300, for example, a negative (−) voltage, may not be delivered to the gate electrodes 604*a*, 604*b*, and 604*c*. Thus, a predetermined voltage may not be measured at the drain electrodes 607*a*, 607*b*, and 607*c*. Accordingly, it may be determined that damage has occurred at the part where the connection line 400 contacts the signal line 300.

When the connection line is damaged somewhere between a point where the connection line 400 is electrically connected to the thin film transistor TFT-D2 and a point where the connection line 400 is electrically connected to the thin film transistor TFT-D3, a voltage applied from the signal line 300, for example, a negative (−) voltage, may be transferred to the gate electrodes 604*a* and 604*b*, but not to the gate electrode 604*c*. Accordingly, a predetermined voltage may be detected in the drain electrode 607*a* and 607*b*, but the predetermined voltage may not be detected in the drain electrode 607*c*. Accordingly, it may be determined that the connection line 400 is damaged somewhere between a point where the connection line 400 is electrically connected to the thin film transistor TFT-D2 and a point where the connection line 400 is electrically connected to the thin film transistor TFT-D3 is damaged.

When the connection line 400 is not damaged, a voltage applied from the signal line 300, for example, a negative (−) voltage, may be transferred to the plurality of gate electrodes 604*a*, 604*b*, and 604*c*, and thus a predetermined voltage may be measured from the plurality of drain electrodes 607*a*, 607*b*, and 607*c*. Accordingly, it may be determined that the connection line 400 is not damaged.

As described above, the detecting unit 600 may be used when disposing the sealant 500 to overlap the connection line 400 to accurately confirm a region where the connection line 400 is not damaged by the sealant 500. The adhering performance of the sealant 500 may be improved while avoiding damage the connection line 400.

The embodiment described above is described based on an example of the pixel defining layer 213, which is an insulating layer, being disposed between the connection line 400 and the sealant 500. In some implementations, disposition of the pixel defining layer 213 between the connection line 400 and the sealant 500 may be omitted. For example, the connection line 400 may directly contact the sealant 500. In this case, the detecting unit 600 may detect whether the connection line 400 is damaged or not in the same manner described above.

Figure 6:
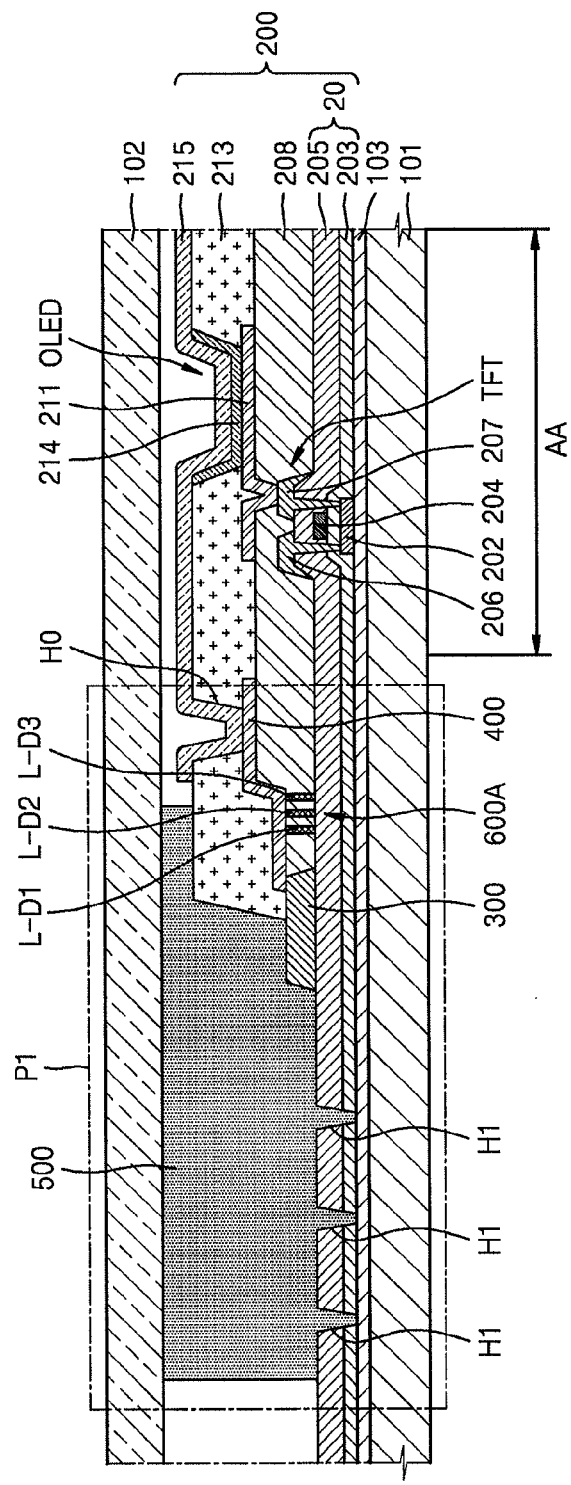
FIG. 6 illustrates a cross-sectional view schematically depicting a part of an organic light-emitting display apparatus according to another embodiment.
Figure 7:
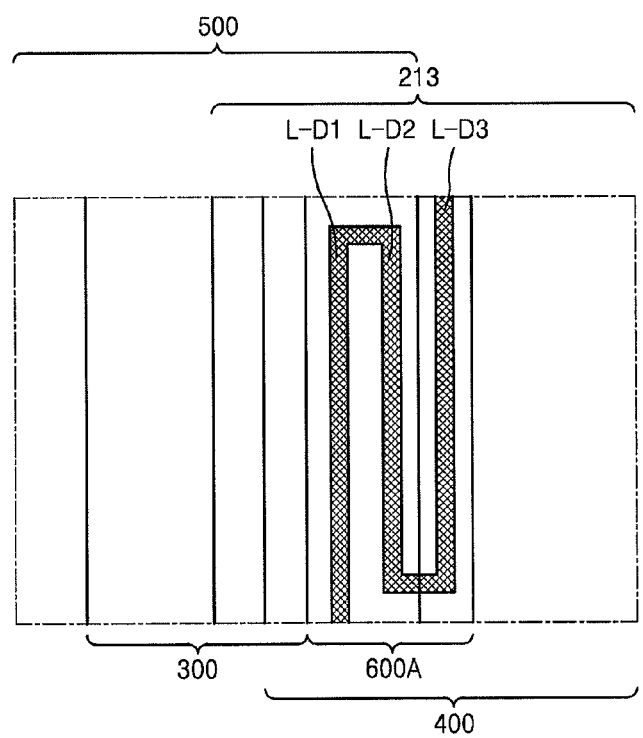
FIG. 7 illustrates a plan view schematically depicting a detecting unit in FIG. 6.

FIG. 6 illustrates a cross-sectional view schematically depicting a part of an organic light-emitting display apparatus 1 according to another embodiment, and FIG. 7 illustrates a plan view of a detecting unit shown in FIG. 6.

Hereinafter, the current embodiment is described based on differences with the previous embodiment of FIG. 4. Like reference numerals in FIG. 6 and FIG. 7 denote like elements in the previous FIG. 2 and FIG. 5.

Referring to FIG. 6, the organic light-emitting display apparatus 1 includes a first substrate 101, a circuit pattern 300 and 400 formed on outer sides of a active area AA of a first substrate 101, a second substrate 102 disposed on a display unit 200, a sealant 500 that adheres the first substrate 101 and the second substrate 102, and a detecting unit 600A that detects whether the sealant 500 and the circuit pattern 300 and 400 are damaged.

The sealant 500 may include a glass frit. A laser may be directed to the sealant 500 to melt and cure the sealant 500. The sealant 500 may serve as a main blocking layer that protects an organic material of the display unit 200 from impurities, such as oxygen and moisture from the outside.

The sealant 500 may overlap a part of the connection line 400. By extending a formation area of the sealant 500 to an area where the connection line 400 is formed, adhesive strength between the first substrate 101 and the second substrate 102 may be improved.

The detecting unit 600A detects whether the connection line 400 is damaged. At least part of the detecting unit 600A is disposed under an area where the connection line 400 overlaps the sealant 500.

The detecting unit 600A may include a plurality of lines L-D1, L-D2, and L-D3 in contact with a plurality of points of the connection line 400. The plurality of lines L-D1, L-D2, and L-D3 may be connected to one another as shown in FIG. 7. In other implementations, the plurality of lines L-D1, L-D2, and L-D3 may not be connected and may be separated from one another.

The plurality of lines may L-D1, L-D2, and L-D3 may be disconnected when the connection line 400 is disconnected due to damage. Accordingly, electrical signals detected from the plurality of lines L-D1, L-D2, and L-D3 may have, for example, different resistance values. For example, when the connection line 400 is not damaged, a predetermined resistance is detected from the plurality of lines L-D1, L-D2, and L-D3 in contact with the connection line 400. In contrast, when the plurality of lines L-D1, L-D2, and L-D3 are disconnected as well due to damage to the connection line 400, resistances of the plurality of lines L-D1, L-D2, and L-D3 may increase rapidly. Thus, whether the connection line 400 is damaged may be detected based on the resistance values of the plurality of lines L-D1, L-D2, and L-D3.

By way of summation and review, in an organic light-emitting display apparatus, sealing between an upper substrate and a lower substrate is desirable to protect an organic light-emitting device from external factors. A sealing member may be applied between the upper and lower substrates and hardened to adhere the upper and lower substrates to each other. The lifespan and reliability of a display device including the organic light-emitting display apparatus may be dependent upon the adhesion degree between the upper and lower substrates.

Embodiments provide an organic light-emitting display apparatus in which a sealing member having improved adhesive strength may be applied without damaging a circuit pattern.

According to embodiments, an organic light-emitting display apparatus may accurately detect an extended range of a sealant by using a detecting unit that detects whether a circuit pattern is damaged within the scope of not damaging the circuit pattern. Therefore, operation reliability of the organic light-emitting display apparatus may be improved as well as the adhesive strength between upper and lower substrates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
   a first substrate;
   a display unit that defines an active area on the first substrate;
   a second substrate on the display unit;
   a circuit pattern on outer sides of the active area on the first substrate;
   a sealant between the first substrate and the second substrate, the sealant adhering the first substrate to the second substrate and overlapping at least a part of the circuit pattern; and
   a detecting unit that overlaps at least a part of the circuit pattern and detects whether the circuit pattern is damaged,
   wherein the detected unit includes a plurality of thin film transistor that are respectively electrically connected to a plurality of points of the connection line.

2. The organic light-emitting display apparatus as claimed in claim 1, wherein the circuit pattern includes:
   a signal line; and
   a connection line that electrically connects the signal line and the display unit.

3. The organic light-emitting display apparatus as claimed in claim 2, wherein:
   the display unit includes:
      a first electrode;
      a second electrode; and
      an intermediate layer between the first electrode and the second electrode, and
   the signal line is electrically connected to the second electrode via the connection line.

4. The organic light-emitting display apparatus as claimed in claim 3, wherein the connection line is formed of a same material as the first electrode.

5. The organic light-emitting display apparatus as claimed in claim 2, wherein the sealant overlaps a part of the connection line.

6. The organic light-emitting display apparatus as claimed in claim 5, wherein:
   at least a part of the detecting unit is under an area where the connection line overlaps the sealant, and
   the detecting unit is electrically connected to the connection line and detects whether the connection line is damaged.

7. The organic light-emitting display apparatus as claimed in claim 2, wherein:
   the connection line and the signal line are positioned on different layers from each other, and
   at least a part of the connection line overlaps the signal line.

8. The organic light-emitting display apparatus as claimed in claim 2 further comprising an insulating layer between the sealant and the signal line.

9. The organic light-emitting display apparatus as claimed in claim 2, wherein a thickness of the connection line is in a range of about 10% to about 30% of a thickness of the signal line.

* * * * *